(12) United States Patent
Gui et al.

(10) Patent No.: US 7,190,434 B2
(45) Date of Patent: Mar. 13, 2007

(54) LITHOGRAPHIC APPARATUS AND DEVICE MANUFACTURING METHOD

(75) Inventors: Cheng-Qun Gui, Best (NL); Arno Jan Bleeker, Westerhoven (NL); Pieter Willem Herman De Jager, Rotterdam (NL); Joost Sytsma, Eindhoven (NL)

(73) Assignee: ASML Netherlands B.V. (NL)

( * ) Notice: Subject to any disclaimer, the term of this patent is extended or adjusted under 35 U.S.C. 154(b) by 65 days.

(21) Appl. No.: 10/779,823

(22) Filed: Feb. 18, 2004

(65) Prior Publication Data

US 2005/0179884 A1 Aug. 18, 2005

(51) Int. Cl.
G03B 27/42 (2006.01)
(52) U.S. Cl. .............................. 355/67; 355/71; 355/53
(58) Field of Classification Search ................. 355/53, 355/67–71; 345/697; 359/290, 739; 356/399–401; 250/548
See application file for complete search history.

(56) References Cited

U.S. PATENT DOCUMENTS

| | | | |
|---|---|---|---|
| 3,732,796 A | 5/1973 | Marcy | |
| 4,023,126 A | 5/1977 | Schlafer | |
| 5,500,736 A | 3/1996 | Koitabashi et al. | 356/401 |
| 5,523,193 A | 6/1996 | Nelson | 430/311 |
| 5,530,482 A | 6/1996 | Gove et al. | 348/441 |
| 5,579,147 A | 11/1996 | Mori et al. | 359/204 |
| 5,617,181 A * | 4/1997 | Yanagihara et al. | 355/46 |
| 5,677,703 A | 10/1997 | Bhuva et al. | 345/84 |
| 5,808,797 A | 9/1998 | Bloom et al. | 359/572 |
| 5,982,553 A | 11/1999 | Bloom et al. | 359/627 |
| 6,133,986 A | 10/2000 | Johnson | 355/67 |
| 6,177,980 B1 | 1/2001 | Johnson | 355/67 |
| 6,229,639 B1 | 5/2001 | Ozarski et al. | |
| 6,687,041 B1 | 2/2004 | Sandstrom | 359/291 |
| 6,747,783 B1 | 6/2004 | Sandstrom | |
| 6,781,672 B2 * | 8/2004 | Motegi | 355/69 |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,870,554 B2 * | 3/2005 | Jain | 345/697 |
| 2004/0041104 A1 | 3/2004 | Liebregts et al. | |
| 2004/0075882 A1 * | 4/2004 | Meisburger | 359/290 |
| 2004/0130561 A1 | 7/2004 | Jain | |

FOREIGN PATENT DOCUMENTS

| | | |
|---|---|---|
| GB | 1334377 | 10/1973 |
| GB | 2 178 548 A | 2/1987 |
| JP | 03183115 | 8/1991 |

OTHER PUBLICATIONS

Partial European Search Report issued May 17, 2005 for Appln. No. Ep 05 25 0801, 5 pages.
European Search Report issued Sep. 9, 2005 for Appln. No. EP 05 25 0801, 6 pages.

* cited by examiner

Primary Examiner—D. Rutledge
(74) Attorney, Agent, or Firm—Sterne, Kessler, Goldstein & Fox PLLC

(57) ABSTRACT

Provided is a radiation distribution system for distributing the radiation from an illumination system to two or more patterning means, each for patterning beams of radiation, which are subsequently projected onto a substrate.

28 Claims, 5 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. A lithographic apparatus can be used, for example, in the manufacture of integrated circuits (ICs), flat panel displays and other devices involving fine structures. In a conventional lithographic apparatus, a patterning means, which is alternatively referred to as a mask or a reticle, may be used to generate a circuit pattern corresponding to an individual layer of the IC (or other device, such as a flat panel display), and this pattern can be imaged onto a target portion (e.g., comprising part of, one or several dies) on a substrate (e.g., a silicon wafer or glass plate) that has a layer of radiation-sensitive material (resist). Instead of a mask, the patterning means may comprise an array of individually controllable elements which serve to generate the circuit pattern.

In general, a single substrate will contain a network of adjacent target portions that are successively exposed. Known lithographic apparatus include so-called steppers, in which each target portion is irradiated by exposing an entire pattern onto the target portion in one pass, and so-called scanners, in which each target portion is irradiated by scanning the pattern through the projection beam in a given direction (the "scanning"-direction) while synchronously scanning the substrate parallel or anti-parallel to this direction.

In a lithographic projection apparatus using arrays of individually controllable elements, it is often necessary to use a plurality of such arrays in order to expose the pattern on a substrate sufficiently quickly that the though-put time for a substrate being exposed in the apparatus is economical. Furthermore, each array requires a relatively large amount of space around it for its support services such as data or control lines required for setting the pattern on each array. It is therefore not appropriate to simply illuminate all of the arrays simultaneously with a single illumination field.

What is needed, therefore, is an approach to provide an arrangement for supplying radiation to each of the arrays of individually controllable elements that is economical and does not introduce additional sources of production error in the pattern exposed on the substrate.

SUMMARY OF THE INVENTION

Consistent with the principles of the present invention as embodied and broadly described herein, an apparatus includes an illumination system for supplying a projection beam of radiation, patterning means serving to the projection beam with a pattern in its cross-section, and second patterning means serving to impart a second beam of radiation supplied by the illumination system with a second pattern. Also included is a substrate table for supporting a substrate, a projection system for projecting the patterned beams onto a target portion of the substrate, and a radiation distribution device that distributes the radiation from the illumination system to the patterning means. The radiation distribution device has a duty cycle during which it sequentially directs substantially all of the radiation from the illumination system to each of a plurality of radiation distribution channels in turn and the radiation distribution channels provide the beams of radiation to the patterning means.

By use of such an arrangement, a single radiation source can efficiently provide radiation for a plurality of patterning means. Consequently, the apparatus cost is reduced by having a separate illumination system for each patterning means. Furthermore, use of a single illumination system reduces the overall size of the apparatus. As a further advantage, by using a single illumination system, the variation in intensity provided to each patterning means may be less than if each patterning means was supplied by an independent illumination system. Consequently, the radiation dose provided by different patterning means will be more consistent, reducing any effects on the pattern produced on the substrate caused by transitions between different regions that have been illuminated at slightly different intensities.

Such an arrangement may, of course, be scaled up to distribute the radiation from one illumination system to three or more patterning means. In a preferred arrangement of each radiation distribution channel directs radiation to a single one of the patterning means. This approach has the advantage of each patterned beam having the full intensity radiation of the illumination system, reducing the time required to provide a given radiation dose.

Alternatively, however, at least one of the radiation distribution channels may include a beam splitter for dividing the radiation directed into that radiation distribution channel and distributing it to two or more patterning means. This arrangement allows a greater number of patterning means to be illuminated by a single illumination system.

The radiation distribution device may include a rotatably mounted reflector and a driver for rotating it. The device is arranged in the path of the beam of radiation from the illumination system such that as the reflector rotates, the reflection of the beam of radiation changes direction. This change, in turn, directs the beam to each of the radiation distribution channels. Such an arrangement provides a simple apparatus for directing substantially all of the radiation from the illumination system to each of the radiation distribution channels in turn, and hence, to each of the patterning means at different times. The illumination system may include a pulsed radiation source providing pulses of radiation at regular intervals. In this case, the reflector may be arranged to rotate at a substantially constant speed, synchronized to the rate of the pulsed radiation source. The synchronization is such that at each pulse, the reflector is at the angle necessary to reflect the beam of radiation from the illumination system into the required one of the radiation distribution channels.

The radiation distribution device may include a plurality of reflectors mounted about an axis of rotation (and associated driver) such that as the plurality of reflectors rotate, each reflector in turn intersects the path of the beam of radiation from the illumination system. During the time when each reflector is in the path of the beam of radiation from the illumination system, the reflector turns, changing the direction of the reflected beam of radiation. Therefore, each reflector may be used to distribute the radiation between the radiation distribution channels. Again, the illumination system may include a pulsed source, providing pulses of radiation at regular intervals. In this case, the rotation of the plurality of reflectors may be synchronized to the pulse rate of the radiation source such that, during each pulse, one of the reflectors is at the appropriate angle to reflect the radiation to one of the radiation distribution channels.

The apparatus may be arranged such that the number of reflectors mounted on the radiation distribution device is an integer multiple of the number of radiation distribution channels. Each reflector is associated with one of the radiation distribution channels. In this case, a pulsed illumination system could be arranged such that, during the time in which each reflector intersects the path of the beam of radiation from the illumination system, one pulse is emitted. Each reflector may then be mounted at an appropriate angle such that during its associated pulse, the reflector is at the required angle relative to the beam of radiation from the illumination system. This approach reflects the beam to the associated one of the radiation distribution channels.

In other words, although the radiation distribution device rotates by the same angle between each pulse of the illumination system, the angle presented by the reflectors relative to the beam of radiation from the illumination system is different for successive pulses. Consequently, successive pulses of the illumination system are directed to different radiation channels by merely rotating the radiation distribution device at a constant speed, synchronized to the pulse rate of the illumination system.

In an alternative arrangement, the reflectors are mounted on the radiation distribution device such that the radiation distribution device rotates through an angle equal to 360 degrees divided by the number of reflectors. When rotating in this manner, the angle of successive reflectors intersecting the beam path at that instant, relative to the beam of radiation from the illumination system, remains constant. In other words, were the illumination system arranged to provide a pulse at those times, the reflected beam from each reflector would follow the same path. However, the radiation source may then be arranged to pulse at regular intervals that do not correspond to the time taken for the time dividing element, rotating at a substantially constant speed, to turn through the angle referred to above.

Accordingly, at each pulse of the illumination system, the beam of radiation from the illumination system is incident on different reflectors. And, at successive pulses, the angle of the reflector relative to the beam of radiation is different, and the beam is reflected to different radiation distribution channels. The advantage of this arrangement is that a simple shaped reflector, for example, one with a cross-section in the shape of a regular polygon can be used. In contrast, in the previously discussed arrangement the cross-section of the reflector would not be regular.

According to a further aspect of the invention, there is provided a lithographic apparatus including an illumination system for supplying a projection beam of radiation and patterning means serving to impart the projection beam with a pattern in its cross-section. Second patterning means are also included. This second patterning means serves to impart a second beam of radiation supplied by the illumination system with a second pattern. Also included are a substrate table for supporting a substrate and a projection system for projecting the patterned beams onto a target portion of the substrate.

The lithographic apparatus further includes a radiation distribution device that distributes the radiation from the illumination system to the patterning means. The radiation distribution device includes a beam divider that divides the beam of radiation from the illumination system into a plurality of portions. Each of the plurality of portions is directed to a distribution channel and the radiation distribution channels provide the beams of radiation to the patterning means. The beam divider comprises a plurality of partially reflective surfaces through which the beam of radiation from the illumination system is successively directed. Each of the partially reflective surface is associated with one of the radiation distribution channels and reflecting a portion of the beam of radiation to said radiation distribution channel.

This arrangement provides an easily controlled means for dividing each pulse of the illumination system, for example, between the patterning means. For example, the proportions of the beam of radiation that are reflected by each of the successive partially reflective surfaces to the associated radiation distribution channels may be selected such that the intensity of the beam of radiation directed to each of the radiation distribution channels is the same. Since these proportions are substantially time-constant, a variation from a perfectly equal distribution of the radiation intensity of the beam of radiation from the illumination system can be measured and therefore, subsequently, be compensated for.

The beam divider may preferably be formed from a plurality of pieces of material that is transparent to the radiation generated by the illumination system, for example from quartz or glass. Each piece of transparent material may have an elongated shape with a radiation-receiving end at one end and the partially reflective surface at the other end. The partially reflective surface may be arranged at an angle relative to the direction of the beam of radiation such that part of the beam of radiation is reflected out of the beam divider to the associated radiation distribution channel and the remainder passes through to the next piece of transparent material.

A coating may be applied to the partially reflective surface in order to adjust the proportion of the radiation that is reflected to the radiation distribution channel, as appropriate. The final piece of transparent material may have a fully reflective surface at the opposite end to its radiation-receiving end such that all of the remaining radiation from the beam generated by the illumination system is directed to the associated radiation distribution channel.

In any one of the arrangements discussed above, the patterning means may preferably be an array of individually controllable elements. Accordingly, the array of individually controllable elements may be set to impart to the associated beam of radiation any desired pattern in its cross-section. Therefore, for example, in apparatus according to the first aspect of the invention, the use of the radiation distribution device has the advantage that while the pattern on one array is being updated (i.e., set to a new pattern), the pattern set on another array may pattern a beam of radiation which exposes the pattern on the substrate.

Additionally, the projection system may include a common element for projecting all of the patterned beams onto the substrate. In other words a single unified projection system may be used. Where arrays of individually controllable elements are being used as the patterning means with such an arrangement, six to nine arrays of individually controllable elements may preferably be used. Alternatively, the projection system may include projection system sub-units that each project the radiation from one of the patterning means onto a separate target portion of the substrate. Accordingly, in such a system, separate control of the projection of each of the patterned beams may be provided.

Furthermore, because each patterning means has its own projection system, the number of patterning means used is not limited by the size of the optical elements that can be manufactured for the projection system. Accordingly a greater number of patterning means may be used. In such an arrangement that uses arrays of individually controllable elements, for example, 20 to 30, or even more, arrays of individually controllable elements may be used.

Furthermore, in any one of the arrangements discussed above, the radiation distribution channels may include a liquid light guide, a glass fiber or other fiber optic cable or any optical beam shaping system with mirrors and lenses for collecting light from the radiation distribution system and directing it to one of the patterning means. This may be necessary if, for example, the direction of the radiation from the radiation distribution device is not aligned with the optical axis of the of the patterning means. Additionally, it may be useful to provide the necessary separation between each of the patterning means (for example, if the patterning means are arrays of individually controllable elements they may require support services, etc.). Finally, such an arrangement also allows for the illumination system and radiation distribution device to be housed separately from the remainder of the apparatus, if required.

In addition, in any of the arrangements described above, the illumination system may comprise a single radiation source, providing a beam of radiation that is distribution to each of the patterning means. Alternatively, the illumination system may comprise two or more independent radiation sources. Each radiation source can generate a beam of radiation. A beam combiner can also be included for combining the separate beams of radiation to form the beam of radiation from the illumination system which is subsequently distributed between each of the patterning means.

This arrangement allows for a beam of greater radiation intensity to be generated by the illumination system. In addition, radiation sources vary in intensity during operation but the variation of the intensity of the sum of the beams of radiation generated by independent radiation sources is lower. The beam combiner may include a radiation beam integrator in order to ensure that, even if the beams of radiation generated by each radiation source have different intensities, the intensity distribution the cross-section of the combined beam of radiation from the illumination system is substantially uniform.

According to yet another aspect of the invention, there is provided a device manufacturing method including the steps of providing a substrate, providing a projection beam of radiation using an illumination system, and using patterning means to impart the projection beam with a pattern in its cross-section. Next, a second patterning means is used to impart a second projection beam of radiation supplied by the illumination system with a second pattern in its cross-section and the patterned beams are projected onto a target portion of the substrate. A radiation distribution device is used to distribute the radiation from the illumination system to the patterning means. The radiation distribution device has a duty cycle during which it sequentially directs substantially all of the radiation from the illumination system to each of a plurality of radiation distribution channels in turn. The radiation distribution channels provide the beams of radiation to the patterning means.

Further embodiments, features, and advantages of the present invention, as well as the structure and operation of the various embodiments of the present invention are described in detail below with reference to the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
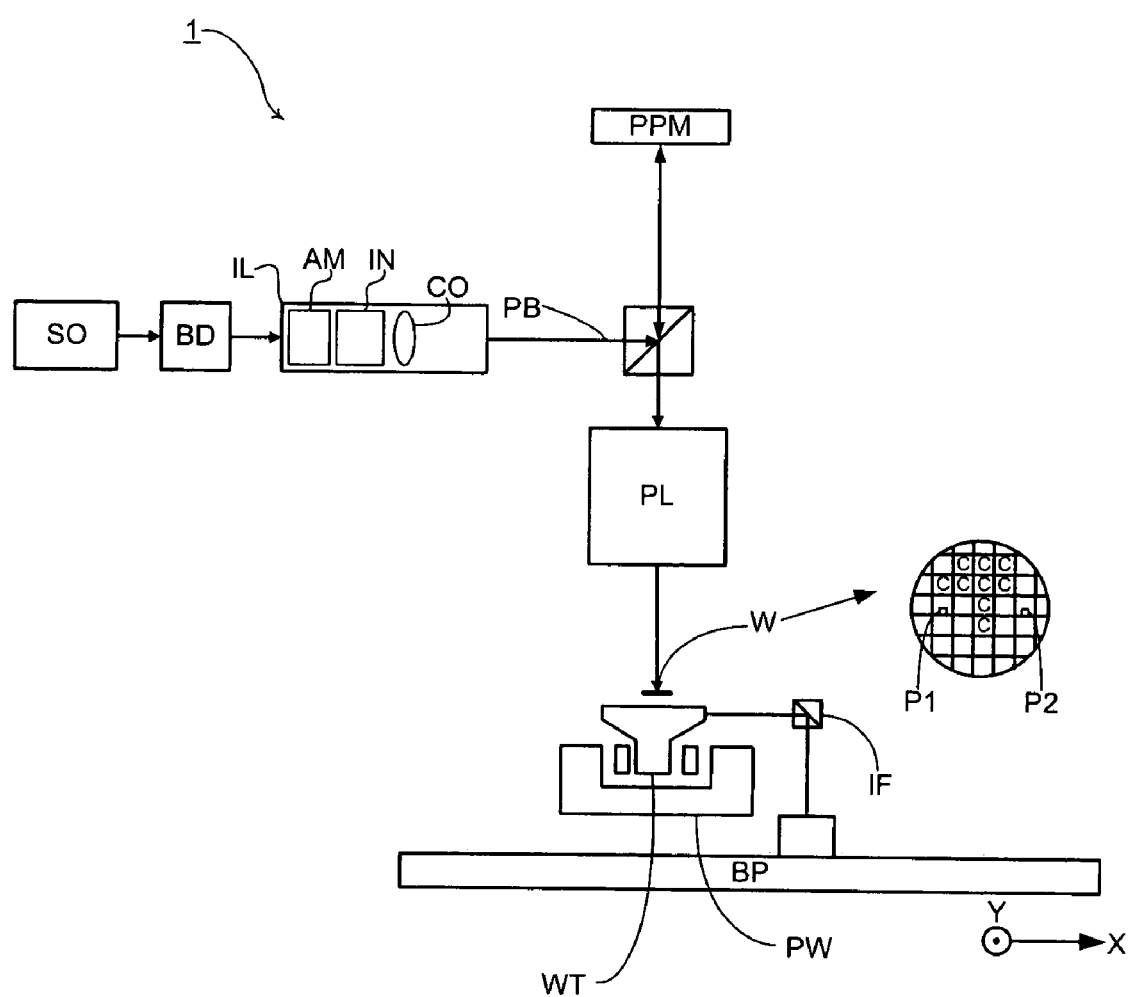
FIG. 1 depicts a lithographic apparatus according to an embodiment of the invention.

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

It would be apparent to one of skill in the art that the present invention, as described below, may be implemented in many different embodiments of software, hardware, firmware, and/or the entities illustrated in the figures. Any actual software code with the specialized control of hardware to implement the present invention is not limiting of the present invention. Thus, the operational behavior of the present invention will be described with the understanding that modifications and variations of the embodiments are possible, given the level of detail presented herein.

As a preliminary matter, the term "array of individually controllable elements" as used herein should be broadly interpreted as referring to any means that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning means are provided below.

A programmable mirror array can comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the said undiffracted light can be filtered out of the reflected beam, leaving only the diffracted light to reach the substrate. In this manner, the beam becomes patterned according to the addressing pattern of the matrix-addressable surface. It will be appreciated that, as an alternative, the filter may filter out the diffracted light, leaving the undiffracted light to reach the substrate.

An array of diffractive optical micro-electro-mechanical systems (MEMS) devices can also be used in a corresponding manner. Each diffractive optical MEMS device is comprised of a plurality of reflective ribbons that can be deformed relative to one another to form a grating that reflects incident light as diffracted light. A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronic means.

In both of the situations described hereabove, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference.

An example of a programmable LCD array of such a construction is given in U.S. Pat. No. 5,229,872, which is incorporated herein by reference.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications. One such other application is the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion", respectively.

The term substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multilayer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 520 nm), as well as particle beams, such as ion beams or electron beams.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

FIG. 1 schematically depicts a lithographic projection apparatus according to a particular embodiment of the invention. The apparatus includes an illumination system (illuminator) IL for providing a projection beam PB of radiation (e.g., UV radiation) and an array of individually controllable elements PPM (e.g., a programmable mirror array) for applying a pattern to the projection beam. In general the position of the array of individually controllable elements will be fixed relative to item PL. However, it may instead be connected to a positioning means for accurately positioning it with respect to the item PL. Also included is a substrate table (e.g., a wafer table) WT for supporting a substrate (e.g., a resist-coated wafer) W, and connected to positioning means PW for accurately positioning the substrate with respect to item PL. Finally, a projection system ("lens") PL is included for imaging a pattern imparted to the projection beam PB by the array of individually controllable elements PPM onto a target portion C (e.g., comprising one or more dies) of the substrate W.

The projection system may image the array of individually controllable elements onto the substrate. Alternatively, the projection system may image secondary sources for which the elements of the array of individually controllable elements act as shutters. The projection system may also comprise a micro lens array (known as an MLA), e.g., to form the secondary sources and to image microspots onto the substrate.

The apparatus depicted here is of a reflective type (i.e., has a reflective array of individually controllable elements). However, in general, it may also be of a transmissive type, for example (i.e., with a transmissive array of individually controllable elements).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as cy-outer and a-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The beam PB subsequently intercepts the array of individually controllable elements PPM. Having been reflected by the array of individually controllable elements PPM, the beam PB passes through the projection system PL, which focuses the beam PB onto a target portion C of the substrate W. With the aid of the positioning means PW (and interferometric measuring means IF), the substrate table WT can be moved accurately (e.g., so as to position different target portions C in the path of the beam PB).

Where used, the positioning means for the array of individually controllable elements can be used to accurately correct the position of the array of individually controllable elements PPM with respect to the path of the beam PB (e.g., during a scan). In general, movement of the object table WT is realized with the aid of a long-stroke module (course positioning) and a short-stroke module (fine positioning), which are not explicitly depicted in FIG. 1. A similar system may also be used to position the array of individually controllable elements.

It will be appreciated that the projection beam may alternatively/additionally be moveable while the object table and/or the array of individually controllable elements may have a fixed position to provide the required relative movement. As a further alternative, that may be especially applicable in the manufacture of flat panel displays, the position of the substrate table and the projection system maybe fixed and the substrate may be arranged to be moved relative to the substrate table. For example, the substrate table may be provided with a system for scanning the substrate across it at a substantially constant velocity.

Although the lithography apparatus according to the invention is herein described as being for exposing a resist on a substrate, it will be appreciated that the invention is not limited to this use and the apparatus may be used to project a patterned projection beam for use in resistless lithography.

The depicted apparatus can be used in four preferred modes. In a step mode, the array of individually controllable elements imparts an entire pattern to the projection beam, which is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

In a scan mode, the array of individually controllable elements is movable in a given direction (the so-called "scan direction", e.g., the Y direction) with a speed v, so that the projection beam PB is caused to scan over the array of individually controllable elements; concurrently, the substrate table WT is simultaneously moved in the same or opposite direction at a speed V=Mv, in which M is the magnification of the lens PL. In scan mode, the maximum size of the exposure field limits the width (in the non-scanning direction) of the target portion in a single dynamic exposure, whereas the length of the scanning motion determines the height (in the scanning direction) of the target portion.

In a pulse mode, the array of individually controllable elements is kept essentially stationary and the entire pattern is projected onto a target portion C of the substrate using a pulsed radiation source. The substrate table WT is moved with an essentially constant speed such that the projection beam PB is caused to scan a line across the substrate W. The pattern on the array of individually controllable elements is updated as required between pulses of the radiation system and the pulses are timed such that successive target portions C are exposed at the required locations on the substrate. Consequently, the projection beam can scan across the substrate W to expose the complete pattern for a strip of the substrate. The process is repeated until the complete substrate has been exposed line by line.

A continuous scan mode is also provided. The continuous scan mode is essentially the same as pulse mode except that a substantially constant radiation source is used and the pattern on the array of individually controllable elements is updated as the projection beam scans across the substrate and exposes it. Combinations and/or variations on the above described modes of use or entirely different modes of use may also be employed.

Figure 2:
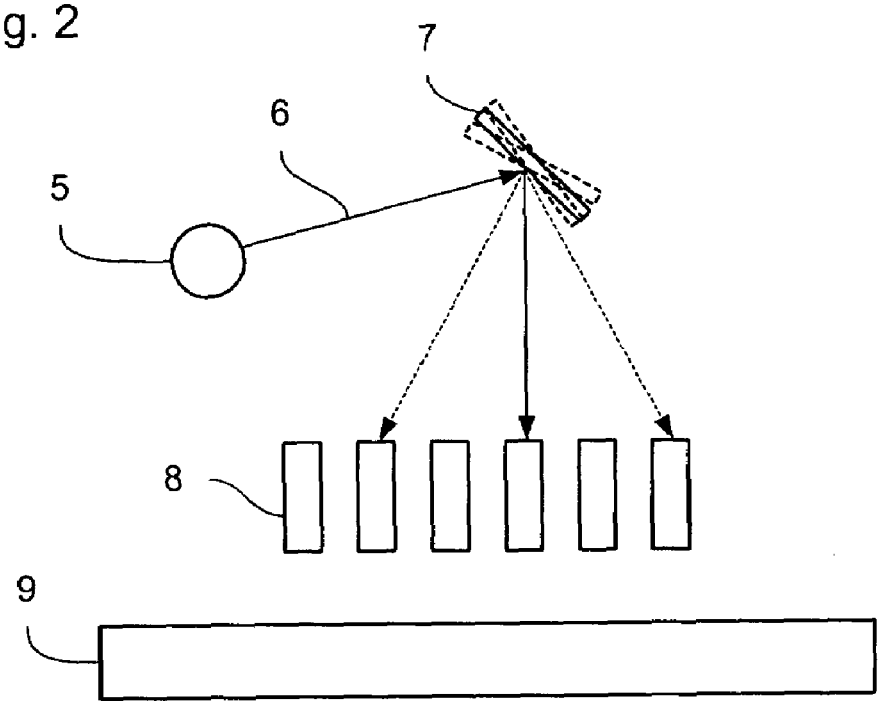
FIG. 2 depicts the arrangement of part of the apparatus according to a first embodiment of the invention.

FIG. 2 schematically represents part of a lithographic projection apparatus. An illumination system 5 produces a beam of radiation 6 which is distributed by a radiation distribution system 7 to a plurality of light engines 8 which pattern the radiation beam and project it onto a substrate 9. Each light engine 8 includes an array of individually controllable elements for patterning a beam of radiation according to a desired pattern and a projection system for projecting the patterned beam onto the substrate. The light engines 8 may also include additional elements for preparing the beam of radiation prior to it being incident on the array of individually controllable elements.

For example, included may be the components to compensate for the angle at which the light engines 8 receive the radiation from the radiation distribution system 7. It will be appreciated that instead of having separate projection systems, a plurality of the light engines may be arranged with a common projection system for simultaneously projecting the patterned beams generated by the arrays of individually controllable elements onto the substrate. Furthermore, it will also be realized that that the present invention is not limited to use with arrays of individually controllable elements for patterning the beams of radiation. In general, any patterning means for imparting a pattern to the cross-section of the beam of radiation may be used in place of the arrays of individually controllable elements described.

As shown in FIG. 2, the radiation distribution system 7 is comprised of a reflector which is rotatably mounted in the path of the beam of radiation 6 from the illumination system 5. At different angles of rotation, the reflector reflects the beam of radiation 6 from the illumination system to different light engines 8. Accordingly, as a driver (not shown) rotates the reflector, the radiation from the illumination system 5 is directed to each of the light engines 8 in turn. The reflector may be arranged to rotate reciprocally such that the radiation is directed backwards and forwards along the line of light engines 8. In order to achieve this, the reflector may to actuated by piezo-electric actuators, by electro-static actuators, by Lorentz actuators or by any other appropriate means.

Alternatively, the reflector may be arranged to rotate at a constant speed around an axis such that the radiation is directed repeatedly along the row of light engines 8. The rotating reflector of the radiation distribution system 7 may be a planar element as shown in FIG. 2. In such an arrangement, both sides of the planar element may comprise reflective surfaces such that for each half turn of the element, the radiation is distributed to each of the light engines 8 in turn.

Figure 6:
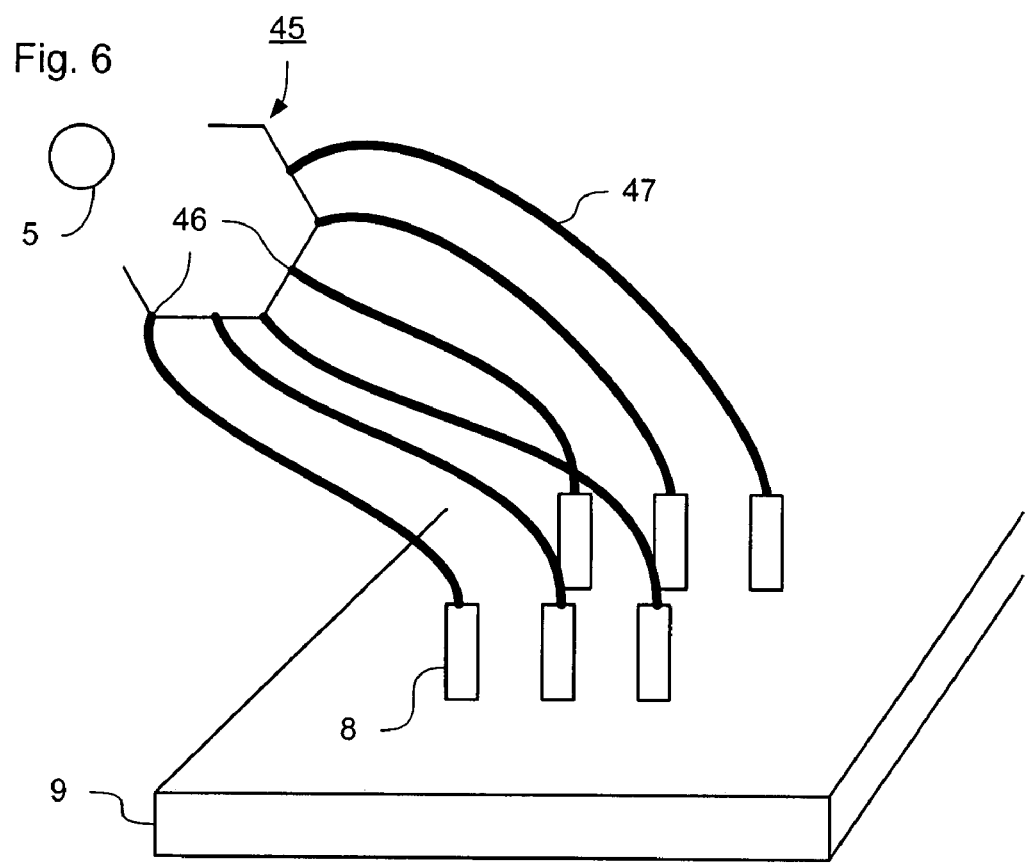
FIG. 6 depicts the arrangement of part of the apparatus according to a second aspect of the invention.

It will be appreciated that, although FIG. 2 shows the light engines 8 arranged in a single row, in practice the light engines may be arranged in any fashion, for example in two or more rows, as convenient. Therefore the radiation from the illumination system 5 will need to be distributed in direction perpendicular to the plane of FIG. 2 as well. This may be arranged by enabling the reflector of the radiation distribution system 7 to not only rotate about an axis perpendicular to the plane of FIG. 2 but also, perhaps by a more limited extent, about a second, orthogonal, axis. Alternatively, the reflector may distribute the radiation about a single axis as shown in FIG. 2 and distribution elements may be provided to carry the radiation to the light engines 8. FIG. 6 illustrates this.

As shown, in FIG. 6, the light engines 8 are arranged in two rows. A radiation distribution unit 45 distributes the radiation from an illumination system 5 to a plurality of radiation distribution channels 46. Distribution elements 47 then carry the radiation from the distribution channels 46 to the light engines 8. Preferably the distribution elements also ensure that the radiation reaches the light engines 8 aligned in a direction parallel to their optical axes.

Figure 7:
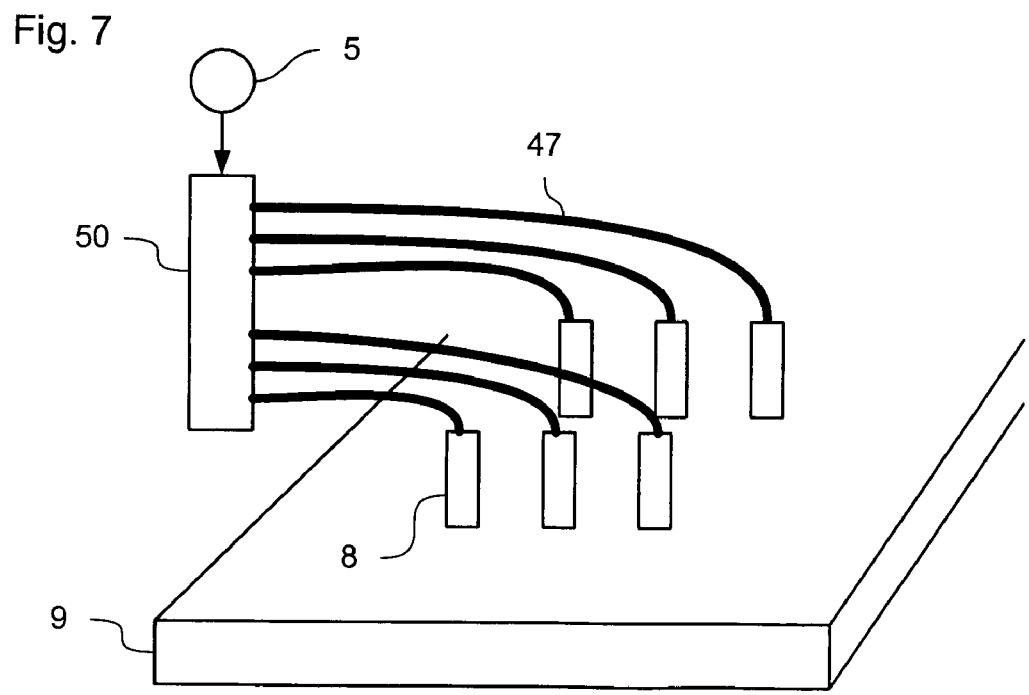
FIG. 7 depicts an alternative arrangement of the part of the apparatus shown in FIG. 6.

FIG. 7 illustrates a similar arrangement but in which the radiation distribution unit 50 is arranged with parallel output beams of radiation instead of the radial arrangement shown in FIG. 6. The radiation distribution elements 47 may be formed from liquid light guides, glass fibers or other fiber optic cables, as appropriate. Consequently, any configuration of outputs from a radiation distribution unit can be used in conjunction with any layout of light engines 8. Furthermore, the illumination system and the radiation distribution system may be contained in a separate housing than that of the remainder of the lithographic apparatus.

If required, the radiation distribution system 7 may also direct radiation to a radiation distribution channel that is not connected to one of the light engines 8. For example, one radiation distribution channel may be connected to a sensor, for example to measure the radiation intensity level. This may be advantageous because many radiation sources vary in intensity over time. However, the variation of the intensity level is typically gradual. Therefore it may only be necessary to monitor the intensity of the radiation periodically.

As a further variation, the radiation from the radiation distribution system 7 may not be directed to each light engine directly. Instead, each radiation distribution channel may include one or more radiation beam splitters for dividing the radiation directed to that channel at any given instant and distributing it to two or more light engines. Similarly, each light engine may include one or more arrays of individually controllable elements that are illuminated in the same field and/or share a common projection system.

In a preferred arrangement, the illumination system 5 produces pulses of radiation at regular intervals, namely includes a pulsed radiation source. In this case, the rotation of the radiation distribution system 7 is synchronized to the pulse rate of the illumination system 5. For example, the synchronization may be such that during a single rotation of the radiation distribution system 7 (or half-turn if, for example, the element is rotating at a continuous speed and is double-sided), the illumination system provides pulses of radiation at each point that the reflector is at the required angle to reflect radiation to each of the radiation distribution channels (or directly to the light engines 8 as shown in FIG. 2).

Alternatively, for example, the synchronization may be such that during each turn, the illumination system provides a pulse for only one of the radiation distribution channels or provides radiation to alternate channels in each rotation. It will be appreciated that other duty cycles can also be considered. For example, if, as discussed above, the light engines 8 are arranged in more than one row, the synchronization may be such that in each rotation of the radiation distribution system 7 about an axis perpendicular to the plane of FIG. 2, the illumination system provides pulses of radiation for each of the light engines 8 in a single row. Subsequently, the radiation distribution element is moved about the second axis and the next rotation of the radiation distribution system 7 delivers radiation to another row of light engines.

Consequently, as described above, the radiation distribution system 7 has a duty cycle in which the radiation from the illumination system is distributed to a plurality of radiation distribution channels in turn. Each of the radiation distribution channels subsequently directs the radiation to one or more light engines containing arrays of individually controllable elements for patterning the beams of radiation. Therefore, while one array of individually controllable elements is being illuminated and the consequent patterned beam of radiation is being projected onto the substrate, other arrays of individually controllable elements may be having the next pattern being set.

This approach is useful because a pulsed radiation source may be able to provide pulses of radiation faster than the arrays of individually controllable elements can be set to new patterns. Therefore, by distributing the pulses of radiation from a single illumination system to a plurality of arrays of individually controllable elements, the illumination system can be used more efficiently and the size and cost of the apparatus is less than if independent illumination systems were required for each light engine, for example.

It will be appreciated that, in addition to synchronizing the radiation distribution system to the pulsed radiation source, it is necessary to synchronize both of these with the updating of the pattern on each of the arrays of individually controllable elements.

The illumination system may comprise a single radiation source. However, it may also comprise two or more radiation sources in order to provide sufficient radiation intensity in each pulse of the illumination system. For example, this may be necessary to keep the exposure time required to achieve a given radiation dose below a set level. The use of multiple radiation sources may also be used to improve the consistency of the radiation intensity over time, thereby improving the control of the radiation dose received in each area illuminated on the substrate.

Consequently, for a given number of light engines that are being used to project patterned beams of radiation onto the substrate, the apparatus may include an illumination system with the same number of radiation sources as there are light engines, a system for combining the beams of radiation produced by each of the sources and, subsequently, a radiation distribution system as described above or below, for re-distributing the radiation between each of the light engines. It will be appreciated that, in general, any number of sources may be used in conjunction with any number of light engines. A further advantage is that even if the intensity of the combined beam of radiation does still vary to some extent, variation between the intensities of the beams of radiation being patterned and projected onto the substrate at a given time will be reduced in comparison with an apparatus using a plurality of independent illuminations system associated with each light engine.

Figure 8:
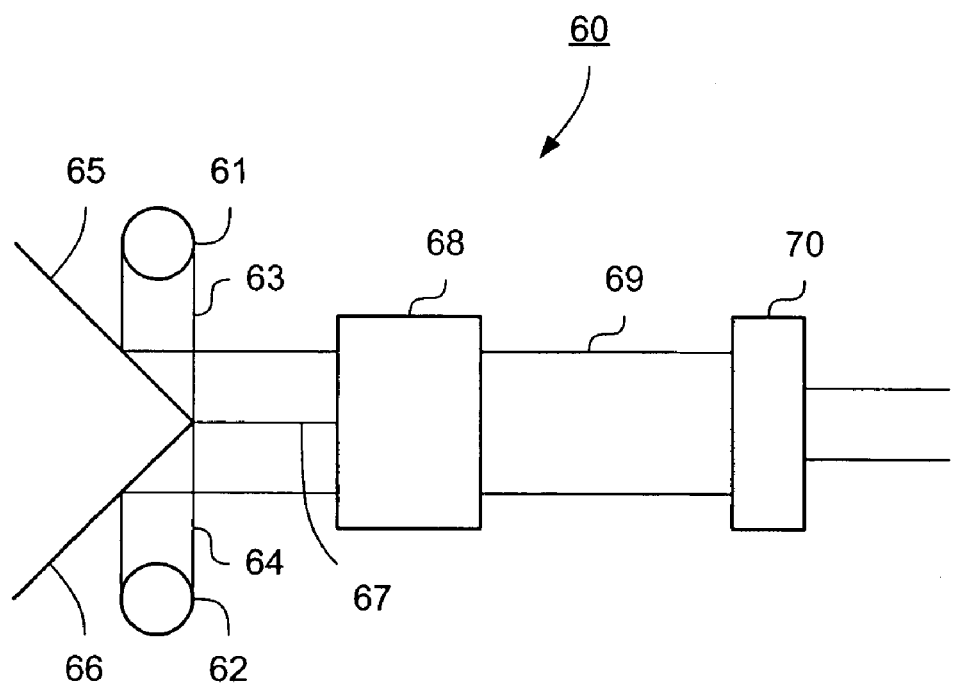
FIG. 8 depicts an arrangement of part of the apparatus according to a third aspect of the invention.

FIG. 8 represents a simple arrangement for combining beams of radiation from two sources. A combining unit 60 comprises two radiation sources 61, 62 producing beams of radiation 63, 64, respectively. The beams of radiation are incident on reflectors 65, 66 to produce a combined beam 67. Preferably, the combined beam 67 passes through an integrator 68, which is used to improve the uniformity of the intensity distribution across the combined beam 67. An integrated beam 69 may then pass through a condenser 70 for reducing the size of the combined beam and, correspondingly, increasing its intensity. It will be appreciated, however, that other beam combining units may also be used with the present invention.

In addition to the above, the illumination system may include a shutter. This may be used to improve the control of the pulses when using a pulsed illumination system. For example, it may be used to provide a required radiation intensity profile over time.

Figure 3:
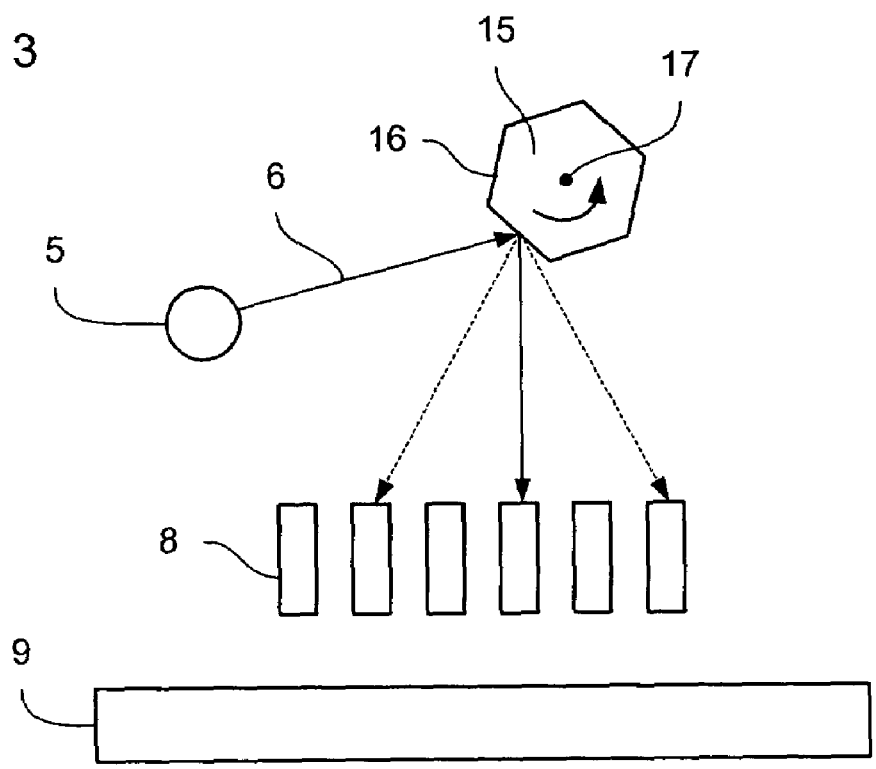
FIG. 3 depicts the arrangement of part of the apparatus according to a second embodiment of the invention.

FIG. 3 schematically represents a second embodiment according to the invention. In this case the planar reflector of the radiation distribution element is replaced by a radiation distribution element 15 with a plurality of reflective surfaces 16 mounted around an axis 17. As the radiation distribution element 15 rotates, each reflective surface 16 in turn intersects the beam of radiation 6 from the illumination system 5. During each such pass, the angle that each reflective surface 16 presents to the beam of radiation 6 from the illumination system 5 changes. Consequently, a beam of radiation reflected from the reflective surface 16 also changes direction during that time. Therefore, in a manner corresponding to that described above in relation to the first embodiment, each reflective surface 16 can be used to distribute the radiation between each of the radiation distribution channels in turn during the time that it intersects the beam of radiation 6 from the illumination system 5.

For example, an apparatus using a pulsed illumination system may be synchronized such that during the time in which each reflective surface 16 intersects the beam of radiation 6, the illumination system 5 generates a plurality of pulses, each corresponding to, and being reflected to, one of the plurality of radiation distribution channels. With such an arrangement, the reflective surfaces 16 may be uniformly distributed around the axis of rotation 17 of the radiation distribution element 15 such that, in cross-section, the combination of the reflective surface 16 forms a regular polygon, as shown in FIG. 3.

In an alternative arrangement according to this embodiment, the apparatus may be configured such that a pulsed illumination system 5 produces only a single pulse of radiation during the time that each reflective surface 16 intersects the line of the beam of radiation 6 from the illumination system 5. In this arrangement, the radiation distribution element 15 may rotate at a constant speed that does not match the pulse rate of the illumination system 5. For example, in such a configuration, during any given number of pulses of the illumination system, the radiation distribution element 15 does not complete a single revolution. Therefore, each pulse of the illumination system 5 is incident on different reflective surfaces 16 of the radiation distribution element 15 and the angle presented by the successive reflective faces 16 of the radiation distribution element 15 at successive pulses is different and the reflected beam is directed to different radiation distribution channels in successive pulses.

Figure 4:
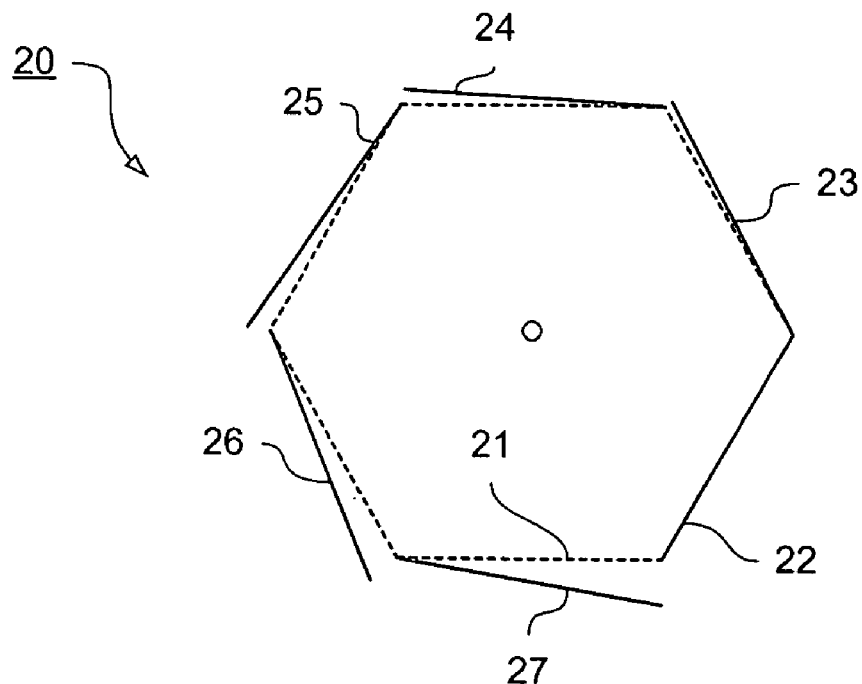
FIG. 4 depicts part of the apparatus in a variant of the second embodiment of the invention.

FIG. 4 is an illustration of a radiation distribution element 20 used in a further variant of the second embodiment of the invention. In this case, the reflective surfaces 22, 23, 24, 25, 26, 27 are not arranged to form a regular polygon. Instead, as schematically represented, each reflector is arranged at a different angle, compared to the other reflective surfaces, to the position that the reflective surface would have been at were they to form a regular polygon (such a regular polygon 21 is shown in broken lines for comparison).

For clarity, the reflective surfaces have not been shown joined to one another. However, it will be appreciated, that in practice, they may be so joined, for example if the radiation distribution element 20 were made from a solid piece of material. With such an arrangement, the radiation distribution element 20 can be arranged to rotate at the same speed as (or an integer multiple of) the pulse rate of the illumination system 5. In particular, although between each pulse of the illumination system the radiation distribution element rotates by a constant amount, the angle presented by each of the reflectors in turn to the beam of radiation 6 from the illumination system is different and therefore the beam is reflected to each of the radiation distribution channels in turn.

It will be appreciated that a combination of the arrangements described above may be used together. For example, a radiation distribution element similar to that shown in FIG. 4 may be used, but in which one or more of the reflective surfaces is also rotated about an axis within the plane of FIG. 4. Consequently, radiation may be reflected to radiation distribution channels (or light engines) arranged in two or more adjacent rows. Additionally or alternatively, an apparatus using a radiation distribution element 20 as shown in FIG. 4 may be arranged such that, during the time that each reflective surface is in line with the beam of radiation from the illumination system, two or more pulses of radiation are incident on each reflective surface as the radiation distribution element 20 rotates. Therefore the beam of radiation is distributed to two or more corresponding radiation distribution channels in each such portion of the duty cycle of the radiation distribution element.

Instead of using reflectors with a flat surface, one or more of the reflectors may have, for example a curved surface. In this case, the profile of the reflector may be chosen such that, over a given time duration during which the reflector rotates, although the angle of the reflector as a whole relative to the beam of radiation from the illumination system changes, the angle of the beam of radiation relative to each point on the surface of the reflector on which it is incident remains constant. Accordingly, during that time duration, the direction of the reflected beam of radiation also remains constant, for example towards the appropriate one of the radiation distribution channels.

If a pulsed radiation source is used, as discussed above, the profiles of the reflectors (or a portion of the reflectors) may be chosen such that during the entirety of a pulse of radiation from the illumination system the radiation is directed towards one of the radiation distribution channels, even if the reflector as a whole rotates by a significant amount relative to the beam of radiation from the illumination system during the pulse.

Alternatively, if a non-pulsed illumination system is being used, the profile of each reflector may be such that for the duration of the time that the radiation beam is incident on a given reflector (as the radiation distribution element rotates), the radiation beam is reflected to the associated radiation distribution channel. As the radiation distribution element rotates further, the beam of radiation from the illumination system becomes incident on another reflector, with a profile such that the beam of radiation is then directed to another radiation distribution channel.

Figure 5:
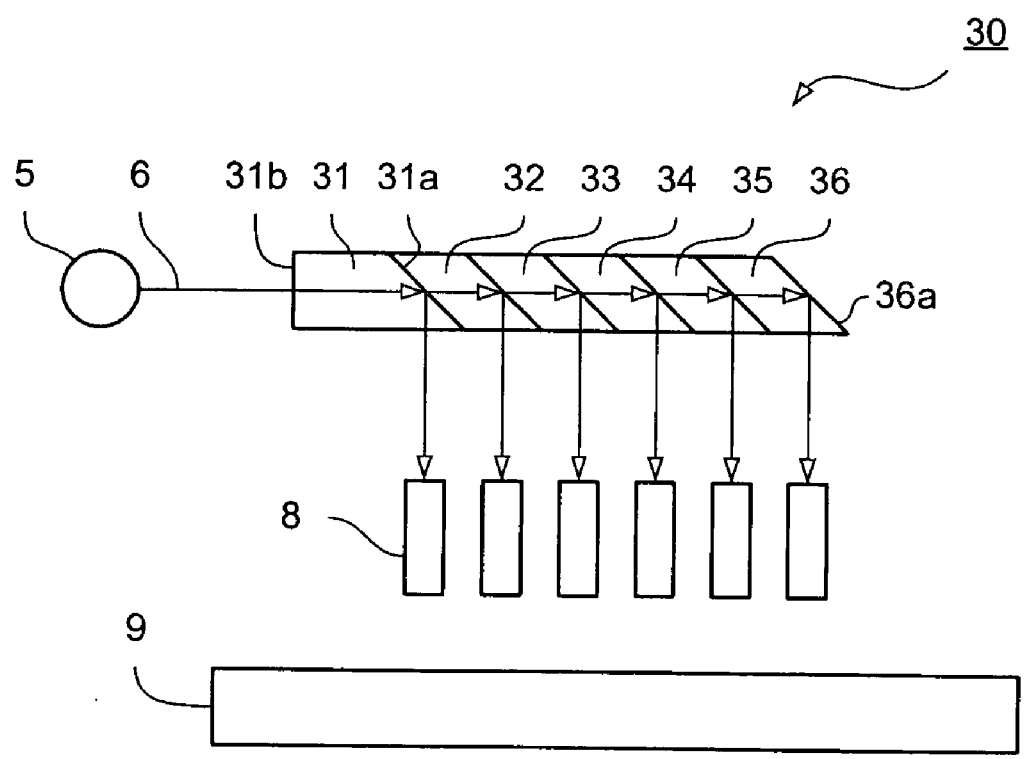
FIG. 5 depicts the arrangement of part of the apparatus according to a third embodiment of the invention.

FIG. 5 represents a third embodiment of the present invention. Provided is a radiation distribution system that can simultaneously provide radiation to two or more radiation distribution channels (or light engines 8). In particular, where a pulsed illumination system is being used, the radiation distribution element 30 can divide each pulse between the radiation distribution channels. Furthermore, the arrangement shown can be used as a beam divider within one of the radiation distribution channels, as described above.

As shown in FIG. 5, a radiation distribution element 30 is comprised of a plurality of sections 31, 32, 33, 34, 35, 36, each associated with a radiation distribution channel or light engine 8. Each section is comprised of a material which is substantially transmissive to the radiation used and, may be formed from rods of glass or quartz, in particular. It will be appreciated, however, that the cross-sectional shape of these sections may be any convenient shape.

The first section 31 has a first end 31b that receives a beam of radiation 6 from the illumination system 5. At the other end, the first section has a partially reflective surface 31a arranged at an angle to the beam of radiation 6. A portion of the beam of radiation 6 is reflected out of the radiation distribution element 30 to an associated radiation distribution channel or light engine 8. The remainder of the beam of radiation passes through the partially reflective surface into the second section 32 of the radiation distribution element 30. As shown, the second section is conveniently shaped such that the end that receives the radiation has a shape corresponding to the partially reflective surface 31a of the first section. However, this need not be the case.

The second section, 32 also has a partially reflective surface at the opposite end, similar to that of the first section that in turn reflects a portion of the remaining beam of radiation out of the radiation distribution element 30 and permits the remainder of the radiation to pass into the third section. This is repeated as necessary until the final section, in the example shown the sixth section 36, which has a fully reflective surface 36a for reflecting the remaining portion of the beam of radiation 6 from the illumination system 5 into the associated radiation distribution channel or light engine 8.

By suitable arrangement of the partially reflective surfaces, the radiation distribution element 30 can be arranged to divide the beam of radiation 6 from the illumination system 5 into a plurality of beams in each radiation distribution channel with equal intensity. For example, different coatings may be used on each of the partially reflective surfaces. Suitable materials for such coatings include fluorides such as cryolite. Furthermore, the proportions of the beam of radiation 6 that will be directed to each of the radiation distribution channels will remain constant over time. Therefore if the distribution of the radiation intensity is not perfectly even, the relative intensities in each of the radiation distribution channels may be measured and compensated for appropriately in the remainder of the apparatus.

It will be appreciated that, as with the previous embodiments, the radiation distribution channels or light engines 8 may be arranged other than in a single row as shown in FIG. 5. In this case radiation distribution elements as shown in FIG. 7 may be used to direct the radiation accordingly or variation of the arrangement of the radiation distribution element 30 shown in FIG. 5 may be used. For example, full reflectors may be arranged between one or more of the section of the radiation distribution element 30 such that the individual sections of the radiation distribution element 30 need not be aligned.

Similarly, alternative configurations of the sections 31, 32, 33, 34, 35, 36, may also be used. For example, the partially reflective surfaces of alternate sections may be angled in opposite directions, reflecting radiation out of the opposite side of the radiation distribution element to the first partially reflective surfaces. Plane reflectors may then be arranged to reflect all of the portions of the beam of radiation through 90 degrees (for example, into the plane of FIG. 5), generating two parallel rows of beams of radiation that may be projected directly to two rows of light engines.

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application specific integrated circuits, firmware, processors executing appropriate software and the like or any combination thereof. Thus, the breadth and scope of the present invention should not be limited by any of the above-described exemplary embodiments, but should be defined only in accordance with the following claims and their equivalents.

What we claim is:

1. A lithographic apparatus, comprising:
an illumination system that supplies a projection beam of radiation;
patterning device for imparting the projection beam with a pattern in its cross-section;
second patterning device for imparting a second beam of radiation supplied by the illumination system with a second pattern;
a substrate table that supports a substrate;
a projection system that projects the patterned beams onto a target portion of the substrate; and
a radiation distribution device that distributes the radiation from the illumination system to the patterning device;
wherein the radiation distribution device has a duty cycle during which it sequentially directs a respective portion of the radiation from the illumination system to each of a plurality of radiation distribution channels in turn, and wherein the radiation distribution channels provide the beams of radiation to the patterning device.

2. A lithographic projection apparatus according to claim 1, wherein the apparatus includes at least three patterning devices for imparting a pattern to a beam of radiation supplied by the illumination system and radiation is provided to each by the radiation distribution channels.

3. A lithographic projection apparatus according to claim 2, wherein at least one of said radiation distribution channels directs radiation to a single one of said patterning devices.

4. A lithographic projection apparatus according to claim 1, wherein at least one of said radiation distribution channels includes a beam splitter that divides the radiation directed into said radiation distribution channel and distributes it to a plurality of patterning devices.

5. A lithographic projection apparatus according to claim 1, further comprising:
   a driver that rotates the reflector, wherein the radiation distribution device comprises a reflector, rotatably mounted in the path of the beam of radiation from the illumination system and arranged such that as the reflector rotates the reflected beam of radiation changes direction, distributing it to each of the radiation distribution channels in turn.

6. A lithographic projection apparatus according to claim 5, wherein the illumination system is arranged to provide pulses of radiation at substantially regular intervals, and wherein the driver rotates the reflector at a substantially constant speed, synchronized to the pulse rate of the illumination system such that during each pulse the reflected beam of radiation is reflected to one of said radiation distribution channels.

7. A lithographic projection apparatus according to claim 1, further comprising:
   a driver that rotates the plurality of reflectors, wherein the radiation distribution device comprises a plurality of reflectors rotatably mounted about an axis such that, as the radiation distribution device rotates, each reflector in turn passes into the path of the beam of radiation from the illumination system for a given time, during which the reflected beam of radiation changes direction, distributing it to each of the radiation distribution channels in turn.

8. A lithographic projection apparatus according to claim 7, wherein the illumination system is arranged to provide pulses of radiation at substantially regular intervals, wherein the driver rotates the plurality of reflectors at a substantially constant speed, synchronized to the pulse rate of the illumination system such that during each pulse the reflected beam of radiation is reflected to one of said radiation distribution channels by one of said reflectors.

9. A lithographic projection apparatus according to claim 8, wherein, during successive pulses of the illumination system, the beam of radiation from the illumination system is incident on different reflectors of said plurality of reflectors, wherein each reflector is associated with one of the radiation distribution channels and arranged such that, during a given one of said pulses of the illumination system associated with said reflector, the reflector is at an angle relative to the beam of radiation from the illumination system such that the beam is reflected to said associated one of the radiation distribution channels.

10. A lithographic projection apparatus according to claim 8, wherein the plurality of reflectors rotate such that successive pulses of radiation are incident on different reflectors and, at successive pulses of the illumination system that are incident on each reflector, the reflector is at different angles relative to the beam of radiation such that the radiation is directed to different radiation distribution channels.

11. A lithographic projection apparatus according to claim 1, wherein at least one of the patterning devices is an array of individually controllable elements that can be set to impart a beam of radiation with a desired pattern in its cross-section.

12. A lithographic projection apparatus according to claim 1, wherein said projection system includes at least first and second projection system sub-units for independently projecting the patterned beams of radiation onto separate target portions of the substrate.

13. A lithographic projection apparatus according to claim 1, wherein said projection system includes a common element for projecting the patterned beams onto the substrate.

14. A lithographic projection apparatus according to claim 1, wherein at least one radiation distribution channel includes a liquid light guide and optical means for collecting light from the radiation distribution system and directing it to one of the patterning devices.

15. A lithographic projection apparatus according to claim 1, wherein the illumination system comprises at least two radiation sources, each providing a source beam of radiation, and a beam combiner that combines said source beams of radiation to form the beam of radiation provided by the illumination system.

16. A lithographic projection apparatus according to claim 15, wherein said beam combiner includes a radiation beam integrator that ensures substantially uniform intensity in the beam of radiation formed from combining said source beams of radiation even if said source beams have different intensities to each other.

17. A lithographic apparatus comprising:
   an illumination system that supplies a projection beam of radiation;
   a patterning device for imparting the projection beam with a pattern in its cross-section;
   a second patterning device for imparting a second beam of radiation supplied by the illumination system with a second pattern;
   a substrate table that supports a substrate;
   a projection system that projects the patterned beams onto a target portion of the substrate; and
   a radiation distribution device that distributes the radiation from the illumination system to the patterning device, wherein the radiation distribution device includes a beam divider that divides the beam of radiation from the illumination system into a plurality of portions, each of which is directed to a distribution channel, and wherein the radiation distribution channels provide the beams of radiation to the patterning devices and the beam divider comprises a plurality of partially reflective surfaces through which the beam of radiation from the illumination system is successively directed in accordance with a distribution device duty cycle, each said partially reflective surface associated with one of the radiation distribution channels and reflecting a portion of the beam of radiation to said radiation distribution channel.

18. A lithographic projection apparatus according to claim 17, wherein the proportions of the beam of radiation from the illumination system which are reflected by each of the successive partially reflective surfaces to the associated radiation distribution channels are arranged such that substantially equal proportions of the intensity of the beam of radiation from the illumination system are directed to each of radiation distribution channels.

19. A lithographic projection apparatus according to claim 17, wherein each of the partially reflective surfaces is arranged on one end of a section of material that is substantially transparent to the radiation, at an angle to the beam of radiation from the illumination system such that a proportion of the radiation incident on each of the partially reflective surfaces is deflected to the associated radiation distribution channel and the remainder passes through to a next section of transparent material.

20. A lithographic projection apparatus according to claim 19, wherein a final section of transparent material comprises a fully reflective surface that reflects substantially all of the radiation directed into said section to one of the radiation distribution channels.

21. A lithographic projection apparatus according to claim 17, wherein each of said radiation distribution channels directs the radiation to a single one of said patterning devices.

22. A lithographic projection apparatus according to claim 17, wherein at least one of the patterning devices is an array of individually controllable elements that can be set to impart a beam of radiation with a desired pattern in its cross-section.

23. A lithographic projection apparatus according to claim 17, wherein said projection system includes at least first and second projection system sub-units that independently projects the patterned beams of radiation onto separate target portions of the substrate.

24. A lithographic projection apparatus according to claim 17, wherein said projection system includes a common element that projects the patterned beams onto the substrate.

25. A lithographic projection apparatus according to claim 17, wherein at least one radiation distribution channel includes a liquid light guide, and optical means for collecting light from the radiation distribution system and directing it to one of the patterning devices.

26. A lithographic projection apparatus according to claim 17, wherein the illumination system comprises at least two radiation sources, each providing a source beam of radiation, and a beam combiner that combines said source beams of radiation to form the beam of radiation provided by the illumination system.

27. A lithographic projection apparatus according to claim 26, wherein said beam combiner includes a radiation beam integrator that ensures substantially uniform intensity in the beam of radiation formed from combining said source beams of radiation even if said source beams have different intensities to each other.

28. A device manufacturing method comprising the steps of:

providing a projection beam of radiation using an illumination system;

using a patterning device to impart the projection beam with a pattern in its cross-section;

using a second patterning device to impart a second projection beam of radiation supplied by the illumination system with a second pattern in its cross-section;

projecting the patterned beams onto a target portion of a substrate; and using a radiation distribution device to distribute the radiation from the illumination system to the patterning devices, wherein the radiation distribution device has a duty cycle during which it sequentially directs a respective portion of the radiation from the illumination system to each of a plurality of radiation distribution channels in turn, wherein the radiation distribution channels provide the beams of radiation to the patterning devices.

* * * * *